United States Patent
Maegawa

[11] Patent Number: 5,126,811
[45] Date of Patent: Jun. 30, 1992

[54] CHARGE TRANSFER DEVICE WITH ELECTRODE STRUCTURE OF HIGH TRANSFER EFFICIENCY

[75] Inventor: Shigeto Maegawa, Itami, Japan

[73] Assignee: Mitsubishi Denki Kabushiki Kaisha, Japan

[21] Appl. No.: 646,414

[22] Filed: Jan. 28, 1991

[30] Foreign Application Priority Data

Jan. 29, 1990 [JP] Japan .................................. 2-20125
Jul. 6, 1990 [JP] Japan ................................. 2-180227

[51] Int. Cl.⁵ ...................... H01L 29/78; H01L 29/34
[52] U.S. Cl. ........................................ 357/24; 357/54; 357/23.15
[58] Field of Search ............ 357/24, 54, 23.15, 24 LR

[56] References Cited

FOREIGN PATENT DOCUMENTS 49-103578 10/1974 Japan .
61-49465 3/1986 Japan .

OTHER PUBLICATIONS

Nelson S. Saks; "Fabrication of surface-channel charge-coupled devices with ultralow density of interface states"; Oct. 15, 1982; Applied Physics Lett.; pp. 737-739.

Primary Examiner—Rolf Hille
Assistant Examiner—Wael Fahmy
Attorney, Agent, or Firm—Leydig, Voit & Mayer

[57] ABSTRACT

A charge transfer device includes a plurality of spaced apart charge transfer electrodes disposed on a semiconductor substrate with an insulating film intervening between the electrodes and between the substrate and the electrodes. The insulating film between the charge transfer electrodes has a higher dielectric constant than other parts of the insulating layer electrode. The insulating film may also have a higher dielectric constant in the region between part of the charge transfer electrodes and the substrate. Therefore, the flattening of a transfer electrode is achieved in a one-layer electrode structure. In addition, a potential "hollow" produced between adjacent charge transfer electrodes is reduced and the loss of transferred charges is reduced.

2 Claims, 12 Drawing Sheets

CHARGE TRANSFER DEVICE WITH ELECTRODE STRUCTURE OF HIGH TRANSFER EFFICIENCY

FIELD OF THE INVENTION

The present invention relates to a charge transfer device, and more particularly to a charge coupled device that can reduce a step at the substrate surface and has an electrode structure having a high transfer efficiency.

BACKGROUND OF THE INVENTION

FIG. 3(g) shows a cross-sectional view of a polycrystalline silicon(polysilicon) electrode of a prior art charge coupled device (hereinafter referred to as "CCD"). In FIG. 3(g), reference numeral 1 designates a p type silicon substrate. An $n^-$ type layer 2 functioning as a charge transfer channel region is produced on the p type silicon substrate 1. A gate insulating film 3 is produced on the charge transfer region 2. First layer polycrystalline silicon (hereinafter referred to as "polysilicon") gate electrodes 4 are produced at predetermined intervals on the gate insulating film 3. Second layer polysilicon gate electrodes 7 are produced on the first layer polysilicon gate electrodes 4 via the gate insulating film 3.

FIGS. 3(a) to 3(f) show cross-sectional views of the main fabrication processes for producing the device of FIG. 3(g). The production process will be described.

First of all, as shown in FIG. 3(a), an $n^-$ type impurity layer 2 is produced in the p type silicon substrate 1 by ion implantation. Next, as shown in FIG. 3(b), the surface of substrate 1 is oxidized to produce a silicon dioxide film 3 at the surface thereof and a first layer polysilicon film 4 is deposited thereon by chemical vapor deposition (CVD). Next, as shown in FIG. 3(c), photoresist 5 is deposited and a predetermined pattern of the photoresist 5 is produced by a photolithography technique. Then as shown in FIG. 3(d), the first layer polysilicon film 4 and the oxide film 3 are etched using the photoresist as a mask to obtain a predetermined pattern of the first layer polysilicon film 4. Next as shown in FIG. 3(e), a silicon dioxide film 3 is produced on the entire surface by oxidizing the surface of substrate and thereafter a second layer polysilicon film 7 is deposited thereon by CVD. Thereafter, as shown in FIG. 3(f), photoresist 8 is deposited and the photoresist 8 is processed to a predetermined pattern through a photolithography technique. Thereafter, the second layer polysilicon 7 is etched using the processed photoresist 8 as a mask and a double-layer polysilicon gate electrode shown in FIG. 3(g) is completed.

The polysilicon electrode which is produced through the above-described process can be produced such that the interval $\Delta g_3$ between the first layer polysilicon film 4 and the second layer polysilicon film 7 is equal to at the most approximately $3 \times t_{ox}$ for the film thickness $t_{ox}$ of the gate insulating film 3.

Next, the charge transfer operation of CCD having the double-layer polysilicon electrode structure as described above will be described with reference to FIG. 4(a).

FIG. 4(a) shows a manner in which four clock signal phases $\phi 1$ to $\phi 4$ are applied to respective electrodes. Here, the four phases as shown in FIG. 5 are used.

At time $t = t_1$ shown in FIG. 5, it is assumed that transfer charges exist below the two electrodes to which clocks $\phi 1$ and $\phi 2$ are respectively applied as shown in FIG. 4(b). In FIG. 4(b), $\ominus$ shows transfer charges. Next, clock $\phi 3$ becomes H from L at time $t = t_2$, a potential well is also produced below the electrode to which clock $\phi 3$ is applied and transfer charges are broadened in a region below the three electrodes to which clocks $\phi 1$, $\phi 2$, and $\phi 3$ are respectively applied. At time $t = t_3$ clock $\phi 1$ changes to L from H and the manner of movement of transfer charges is as shown in FIG. 4(d). When clock $\phi 1$ changes to L from H, the potential below the electrode to which clock $\phi 1$ is applied becomes shallow and the transfer charges move to a region under the electrodes to which clocks $\phi 2$ and $\phi 3$ are respectively applied. Then as shown in FIG. 3(g), because the interval $\Delta g_3$ between the first layer polysilicon 4 and the second layer polysilicon gate 7 is approximately $3 \times t_{ox}$, such a large "hollow" that influences the charge transfer is not produced in the potential well at a place between the first layer polysilicon 4 and the second layer polysilicon gate 7, which place is shown by dotted line circle A in FIG. 4(d) and, it is possible to transfer charges without losing charges. As a result, at time $t = t_4$ shown in FIG. 5, transfer of charges to a region below the two electrodes to which clocks $\phi 2$ and $\phi 3$ are respectively applied from a region below the two electrodes to which clocks $\phi 1$ and $\phi 2$ are respectively applied is completed as shown in FIG. 4(e).

In the electrode structure produced by the processes as shown in FIGS. 3(a) to 3(g), it is possible to produce the transfer electrode interval $\Delta g_3$ so narrow that charge loss does not occur during the transfer of charges. However, in the structure produced by this process, after completing the process as shown in FIG. 3(g), steps in the polysilicon gate electrodes 7 are produced on the substrate surface and the coverage property of an upper layer film produced later is poor, thereby resulting in deterioration in the insulating property and conductive property of the upper layer film. In addition, while using the upper layer film as a light shielding film, the poor coverage results in insufficient light shielding.

Noticing on these problems, there is an attempt to produce a transfer electrode from only one-layer of polysilicon thereby to remove steps caused by the gate electrode and reduce the poor coverage of the upper layer film.

FIGS. 6(a) to 6(d) show cross sectional views of production processes of a prior art one-layer polysilicon transfer electrode. The production process will be described.

As shown in FIGS. 6(a) to 6(c), an $n^-$ type layer 2 is produced on the substrate 1, an insulating film 3 is produced on the $n^-$ type diffusion layer 2 and further a polysilicon film 4 is deposited on the insulating film 3, and thereafter, photoresist 5 is deposited on the polysilicon film 4 and it is processed to have a predetermined pattern by photolithography similarly as in the prior art device of FIGS. 3(a) to 3(c). Here, the photoresist 5 is patterned to have a minimum gap $\Delta g_4$ as shown in FIG. 6(c) different from the prior art example of FIG. 3(g). The polysilicon film 4 is etched using this patterned photoresist as a mask and as shown in FIG. 6(d). The interval $\Delta g_4'$ between adjacent gate electrodes is made approximately equal to that of the above-described interval $\Delta g_4$.

The transfer electrode 4 which is produced through these processes has a step which is reduced relative to the case where a transfer electrode is produced using a double-layer polysilicon and can be produced without causing deterioration in the coverage of an upper layer film is produced in a later process. It is also possible to produce an electrode having a low resistance by adopting as material, such as a polycide structure comprising not only polysilicon but polysilicon and tungsten silicide, for the transfer electrode. Then, the electrode can also function as a light shielding film.

In the prior art CCD in which a transfer electrode is produced by one-layer polysilicon, the step is reduced with relative to the case where a transfer electrode is produced using a double-layer polysilicon. On the other hand, the interval between the transfer electrodes which can be realized is determined by the minimum producible feature size of the photoresist and the processing precision of polysilicon using the photoresist as shown in FIG. 6(c). Therefore, the separation interval $\Delta g_4'$ of polysilicon serving as a transfer electrode after the processing is wider than the transfer electrode interval $\Delta g_3 = 3 \times t_{OX}$ (FIG. 3(g)) which is obtained in a case where the double-layer polysilicon is used.

For example, although in the above-described double-layer polysilicon gate electrode structure, when the film thickness $t_{OX}$ of the gate insulating film 3 is, for example, 0.05 to 0.1 micron, the interval $\Delta g_3$ between adjacent gate electrodes can be below 0.15 to 0.3 micron. In the above-described one-layer polysilicon gate electrode structure, the minimum size $\Delta g_4$ of photoresist 5 which is producible by photolithography is limited to about 0.4 micron and the interval $\Delta g_4'$ between the gate electrodes using this pattern as a mask is approximately 0.6 micron.

Generally, when a driving clock signal is applied, there is a tendency that the potential level of the n⁻ type layer 2 which is produced below the gate insulating film 3 increases as the film thickness $t_{ox}$ of the gate insulating film 3 increases. Accordingly, as shown in FIG. 8, when the interval between the gate electrodes is widened, the difference between the effective gate insulating film thickness $t_{ox}$, measured from the edge of the gate electrode 4 and to the n⁻ type layer 2 between the gate electrodes, and the gate insulating film thickness $t_{ox}$, measured between the gate electrode 4 and the n⁻ type layer 2 increases Therefore, relative to the potential level of the n⁻ type layer directly below the gate electrode 4, the potential level of the n⁻ type layer between the gate electrodes 4 is unfavourably increased and a potential level difference $\Delta E$ arises between those parts of the n⁻ type layer 2.

The operation of the charge transfer in a case where a potential level difference $\Delta E$ is generated in this way will be described with reference to FIG. 7. As shown in FIG. 7(a), four clock signal phases $\phi 1$ to $\phi 4$ are applied and those clock signals shown in FIG. 5 are used for these clocks. It is assumed that transfer charges exist at below the electrodes to which clocks $\phi 1$ and $\phi 2$ are respectively applied at time $t = t_1$ as shown in FIG. 7(b) similarly as in the cases of FIGS. 4(a) and 4(b). A state where the clock $\phi 3$ becomes H from L at time $t = t_2$ similarly as in FIG. 4(c) is shown in FIG. 7(c). Thereafter, when the clock $\phi 1$ changes to L from H at time $t = t_3$, the transfer charges move to the charge transfer channel region below the electrode to which clock $\phi 2$ is applied from the charge transfer channel region below the electrode to which clock $\phi 1$ is applied. Here, because the separation interval $\Delta g_4'$ between the transfer electrodes 4 is larger than the separation interval between the transfer electrode $\Delta g_3 = 3 \times t_{OX}$ in a case where double-layer polysilicon is used, the difference in the potential level directly below the transfer electrode and below a location between the transfer electrodes in the n⁻ type layer 2 increases and a "hollow" of potential clearly appears at a part which is shown by dotted line circle B in FIG. 7(d). Accordingly, part of charges remain in this hollow during the transfer and a transfer loss arises as shown in FIG. 7(e).

SUMMARY OF THE INVENTION

The present invention is directed to solving the above-described problems and has for its object to provide a charge transfer device flattening the transfer electrode, reducing the generation a potential hollow as described above, even when the separation interval between transfer electrodes is wide, and having a low transfer loss.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with the present invention, in a CCD electrode structure comprising a plurality of charge transfer electrodes produced on a charge transfer channel region produced on a semiconductor substrate or a semiconductor layer with an intervening insulating film, at least some of the insulating layer between the charge transfer electrodes have a higher dielectric constant than the insulating film directly below the charge transfer electrode. The flattening of a transfer electrode is performed by using a one-layer electrode structure. In addition, a potential "hollow" produced between transfer electrodes is reduced and the loss in transferred charges is reduced.

BACKGROUND OF THE INVENTION

FIGS. 1(a)-1(e) are cross-sectional views showing a production process of a CCD charge transfer device in accordance with a first embodiment of the present invention;

FIG. 2(a) is a cross-sectional view of a charge transfer device in accordance with an embodiment of the invention and FIGS. 2(b)-2(e) are diagrams showing the potentials at the charge transfer channel region of the CCD for of FIG. 2(a) explaining the operation of the first embodiment;

FIGS. 3(a)-3(g) are cross-sections showing the production process of a prior art CCD device;

Figure 9:
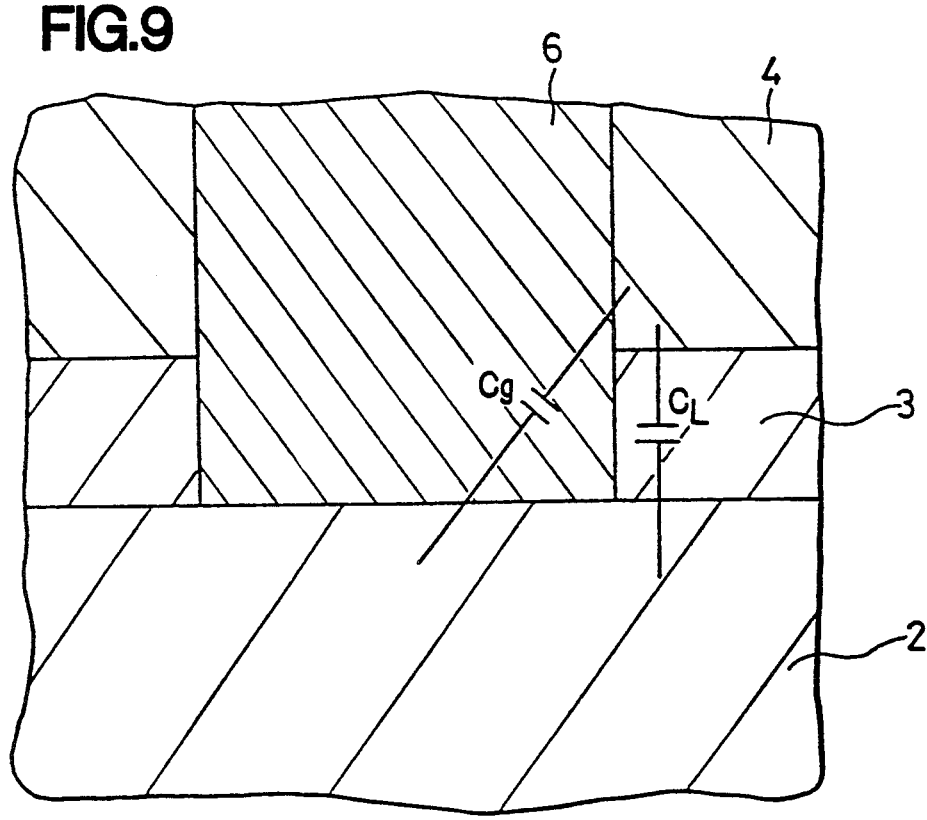
Figure 7A:
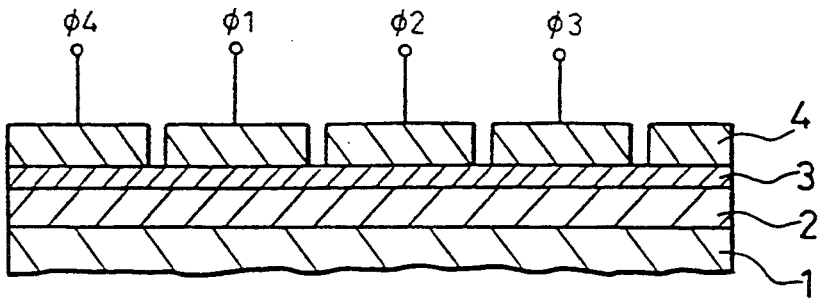
Figure 7B:
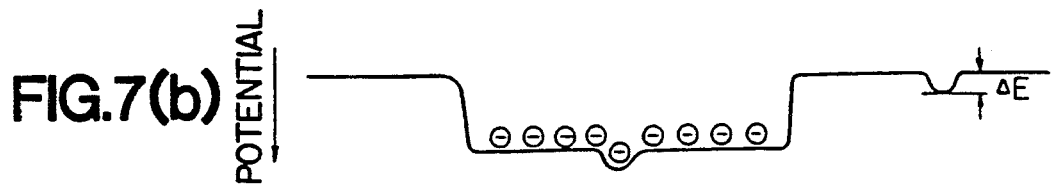
Figure 7C:
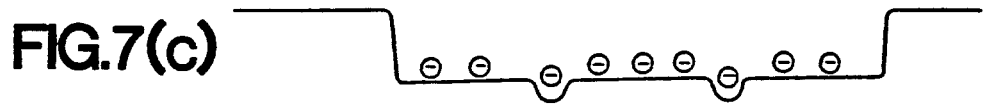
Figure 8:
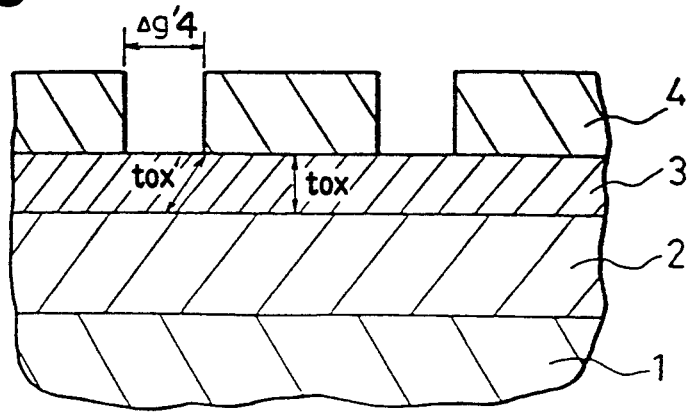
Figure 10A:
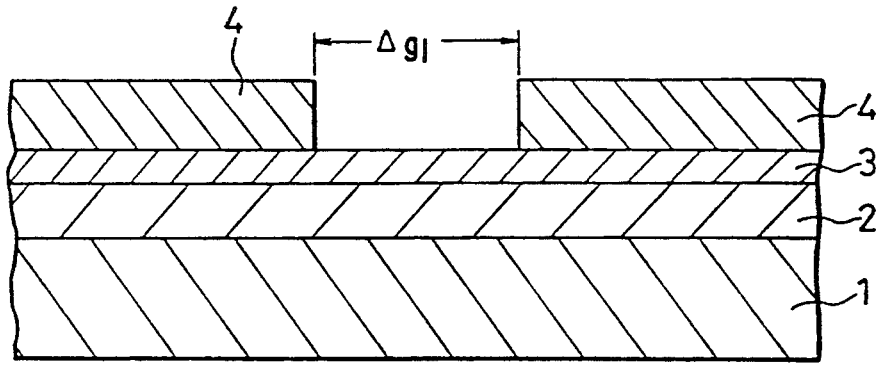
Figure 10B:
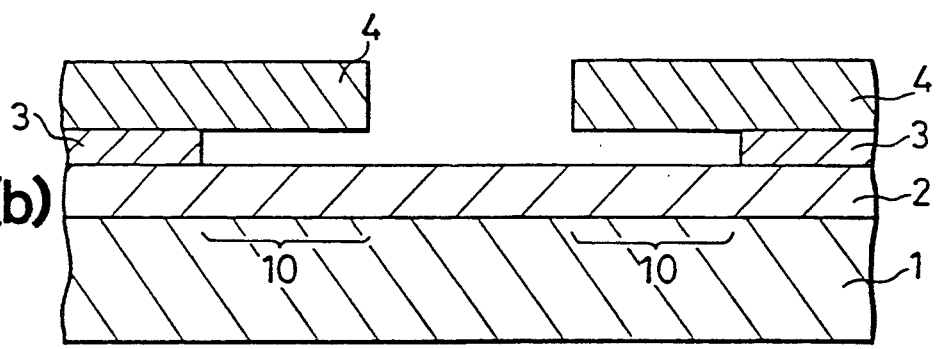
Figure 10C:
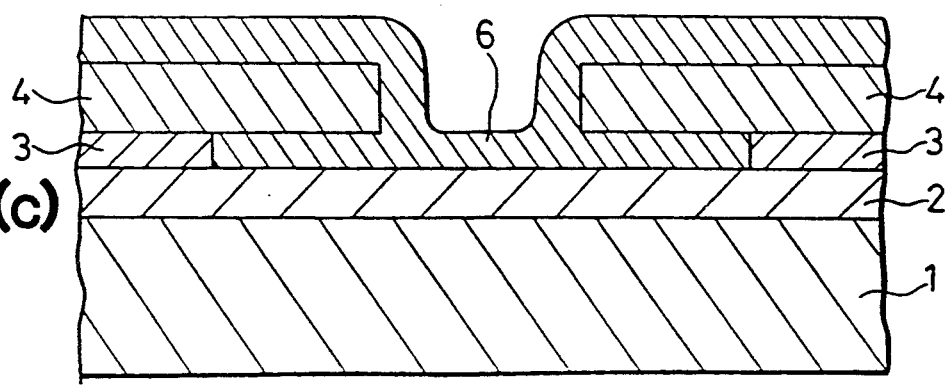
Figure 11A:
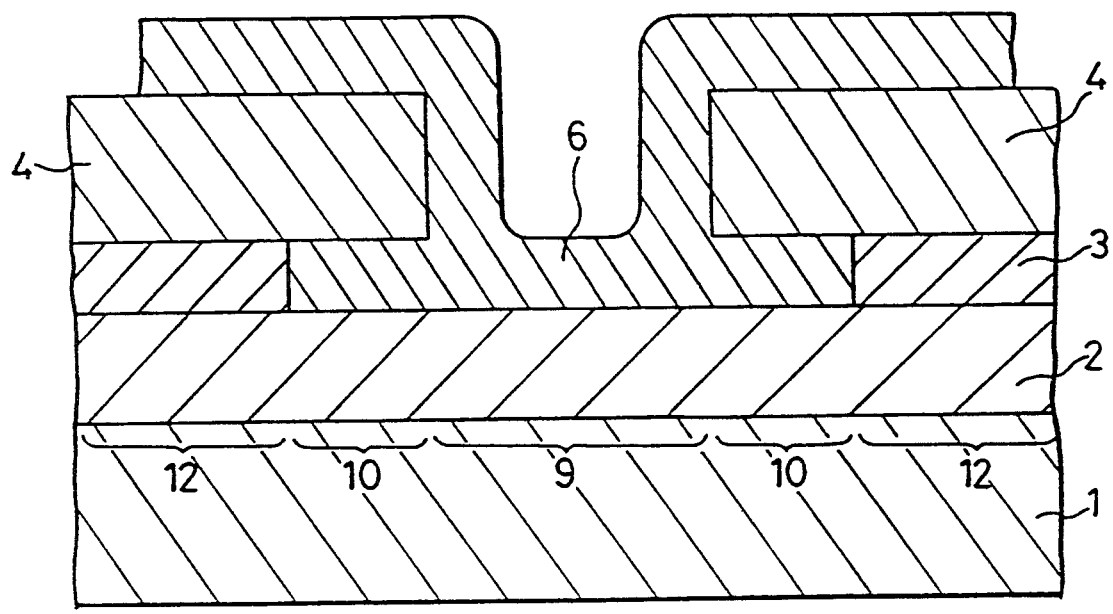
Figure 11B:
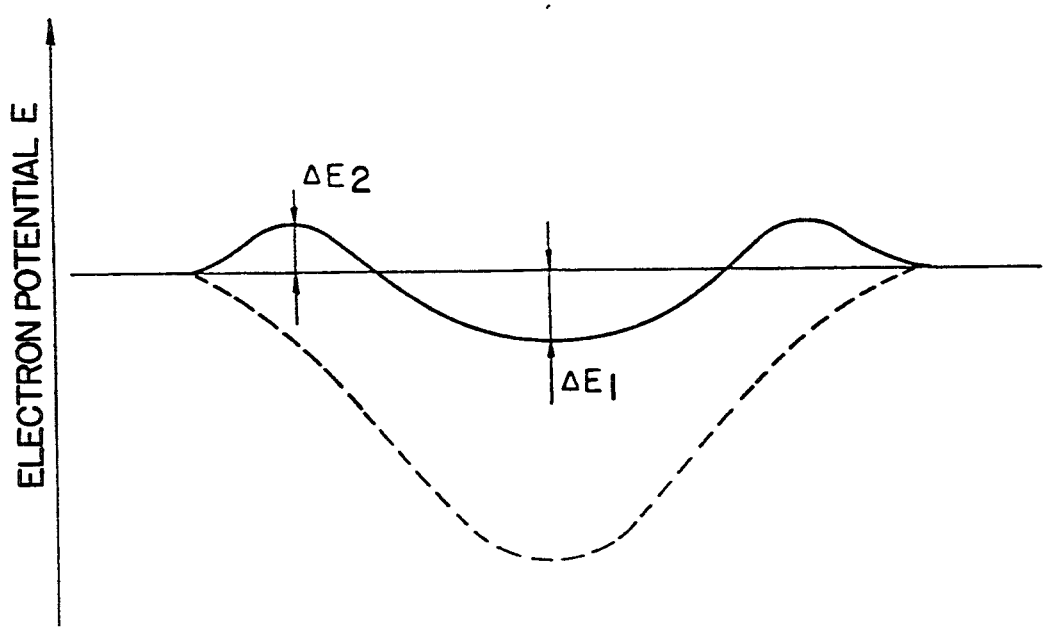
Figure 12A:
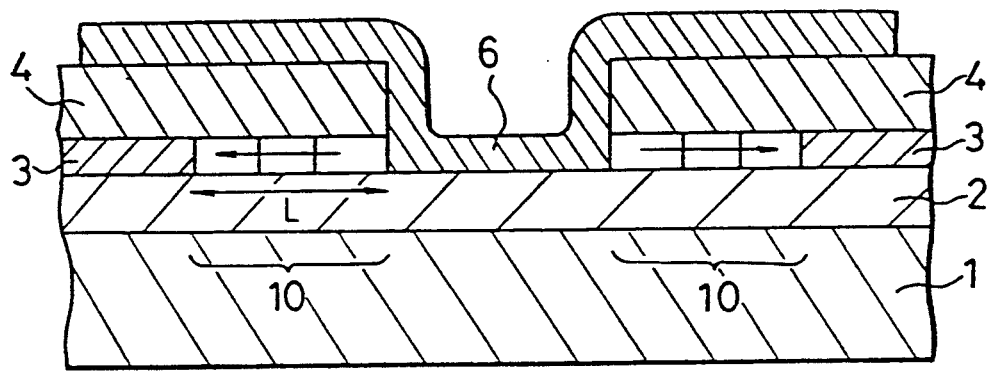
Figure 12B:
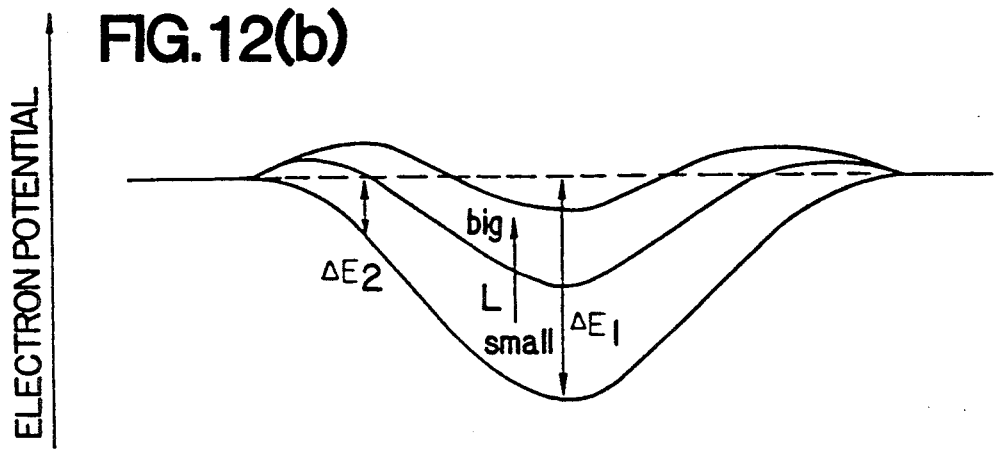
Figure 12C:
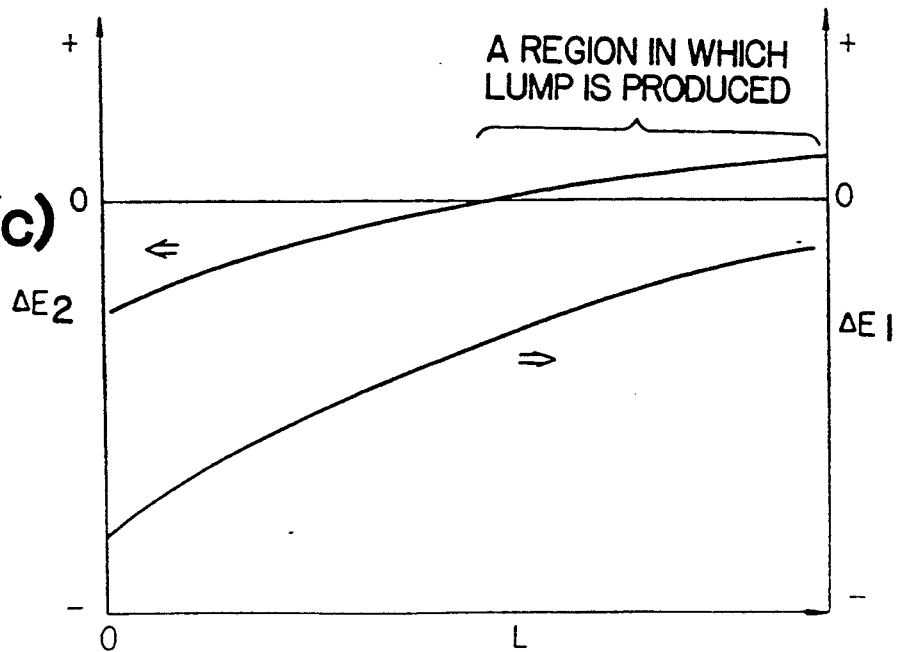

FIGS. 6(a)-6(d) are diagrams showing cross-sections in the production process of a prior art CCD device;

FIG. 7(a) is a cross-sectional view of a charge transfer device in accordance with the prior art and FIGS. 7(b)-7(c) are diagrams showing potentials at the transfer channel region of the CCD shown in FIG. 7(a);

FIG. 8 is a diagram for explaining problems in the other prior art device;

FIG. 9 is a diagram for explaining the principle of the present invention;

FIGS. 10(a)-10(c) are cross-sectional views showing a production process of a CCD charge transfer device in accordance with a second embodiment of the present invention;

FIG. 11(a) is a cross-section and FIG. 11(b) is a diagram of the potential distribution of CCD of the second embodiment; and FIG. 12(a) is a cross-sectional view and FIGS. 12(b) and 12(c) are diagrams for explaining the effects of the charge transfer device of the second embodiment of the present invention.

DETAILED DESCRIPTION OF THE PREFERRED EMBODIMENTS

Embodiments of the present invention will be described in detail with reference to the drawings.

FIG. 1 shows production processes of a CCD charge transfer device in accordance with a first embodiment of the present invention. The same reference numerals as those used in those figures designate the same or corresponding portions. Reference numerals 5a, 5c designate photoresist. Reference numeral 5b designates a silicon dioxide film. Numeral 6 designates a silicon nitride film and numeral 9 designates an n− type layer.

Figure 1A:
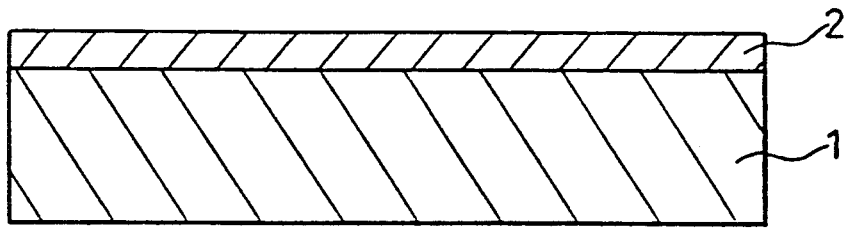

A description is given of the production method of this embodiment. First of all, as shown in FIG. 1(a), in a p type silicon substrate 1 containing p type impurity ions such as borons in a concentration of $1 \times 10^{14}$ cm$^{-3}$ to $1 \times 10^{15}$ cm$^{-3}$ (or in a p type well produced to have the above-described concentration in an n type silicon substrate), n type impurity ions such as phosphorus are implanted under conditions of 50 KeV to 100 KeV and $1 \times 10^{12}$ to $1 \times 10^{13}$ cm$^{-2}$, and thereafter, annealing of 15 minutes to one hour is carried out at 900° to 1100° C., thereby producing an n− type layer 2 of 0.3 to 1 micron.

Figure 1B:
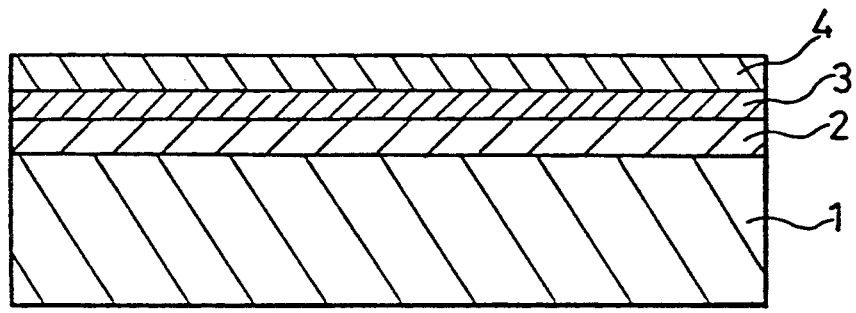

Next, as shown in FIG. 1(b), the surface of substrate 1 is oxidized to produce a silicon dioxide film 3 to about 0.05 to 0.2 micron in thickness, and thereafter, a polysilicon film 4 is deposited thereon to a thickness of 2000 to 6000 angstroms by CVD method.

Figure 1C:
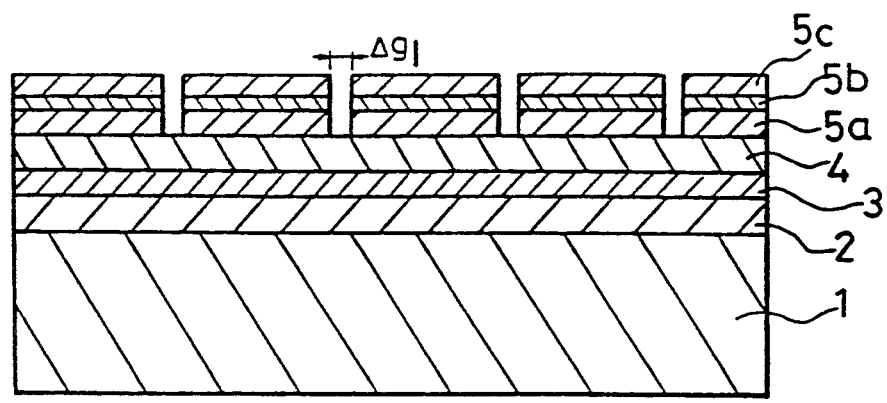
Figure 1D:
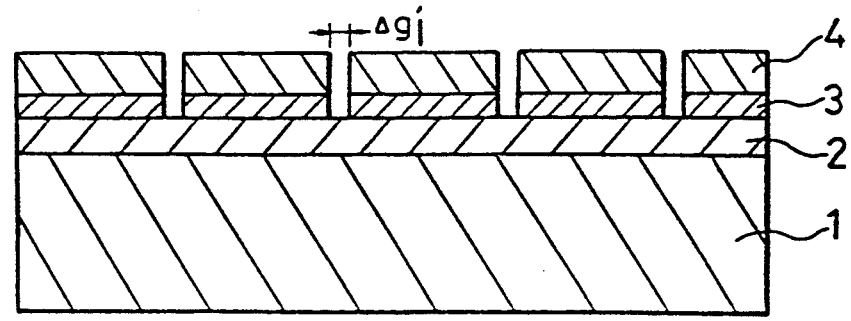

Next, as shown in FIG. 1(c), a first photoresist 5a is deposited on the entire surface of substrate to a thickness of 1.7 microns, a silicon dioxide film 5b is deposited thereon to a thickness of 0.1 to 0.2 micron, and a second photoresist 5c is deposited thereon to a thickness of about 0.5 micron to produce a triple-layer. Thereafter, the second layer photoresist 5c is processed by photolithography process to have a predetermined pattern width and pattern interval of $\Delta g_1$ which is producible with a minimum size of about 0.4 micron. Thereafter, the second photoresist film 5c after the processing is used as a mask to etch the oxide film 5b therebelow by anisotropic etching such as RIE, and further the first photoresist 5a is etched using the second photoresist 5c and the oxide film 5b as a mask. Finally, using the first photoresist 5c, the oxide film 5b, and the first photoresist 5a as a mask, the polycrystalline silicon 4 is etched similarly by anisotropic etching and the oxide film 3 is etched to produce a one-layer gate electrode of gate interval $\Delta g_1'$ (=about 0.6 micron). In the processing using the triple-layer photoresist structure comprising a thick lower layer photoresist 5a, an oxide film 5b, and a thin upper layer photoresist 5c, it is possible to prevent the influence of a step in the underlying substrate as well as to improve the resolution. Further, the influences by the reflection of the underlying film is relaxed and it is possible to obtain a fine pattern.

Figure 1E:
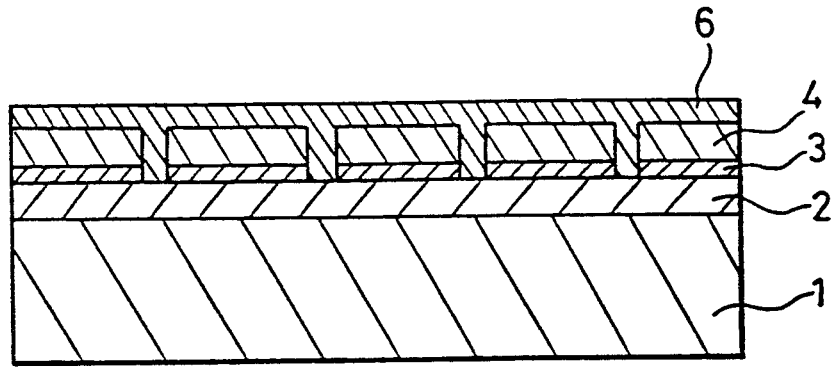

Next, as shown in FIG. 1(e), the silicon nitride film 6 is deposited on the entire surface by CVD. The film thickness is made thicker than that of the oxide film 3. In this structure the oxide film 3 exists under the polycrystalline silicon 4 of the gate electrode and the silicon nitride film 6 exists between the polycrystalline silicon regions 4 and between the oxide films 3 as insulating film as an shown in FIG. 9.

In such a buried channel type MOS structure, the potential of the channel becomes higher as the capacitance between the channel region and the electrode becomes smaller. The fact that the potential of the region between the gate electrodes is high as described above, is caused by this fact. However, when the nitride film 6 exists on the channel between the gate electrodes, because the nitride film has a dielectric constant higher than that of the oxide film (about twice), the capacitance $C_g$ between the gate electrode and the channel below the inter-electrode region is approximately the same as the capacitance $C_L$ directly below the gate electrode, even though the effective insulating film thickness (which appears in the diagonal direction) is thicker than that directly below the gate electrode. Therefore, the channel potential below the inter-gate electrode is approximately the same as that of the other region and the "hollow" in the potential well is removed.

A description is given of the charge transfer operation of the above-described embodiment.

Figure 2A:
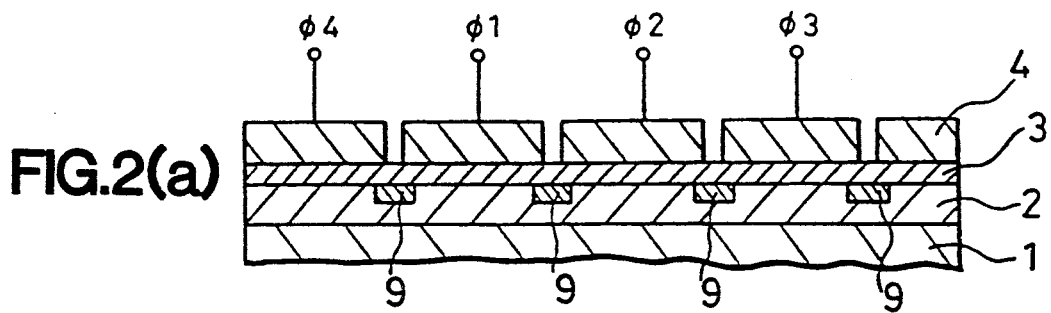
Figure 2B:
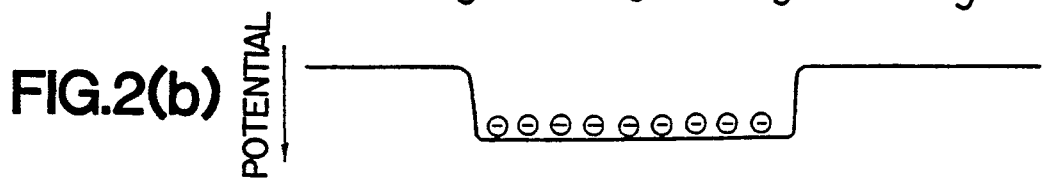
Figure 2C:
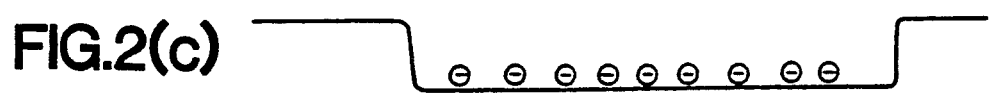
Figure 2D:
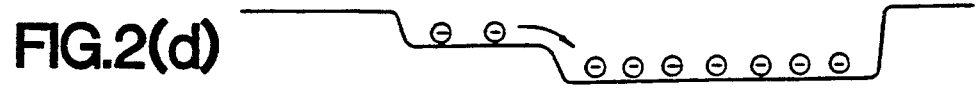
Figure 2E:
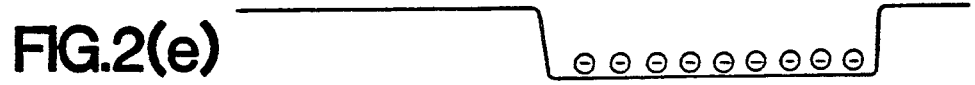
Figure 3A:
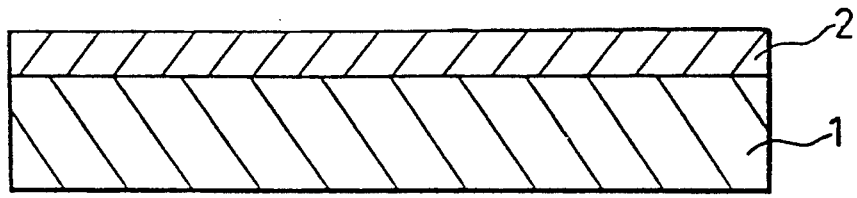
Figure 3B:
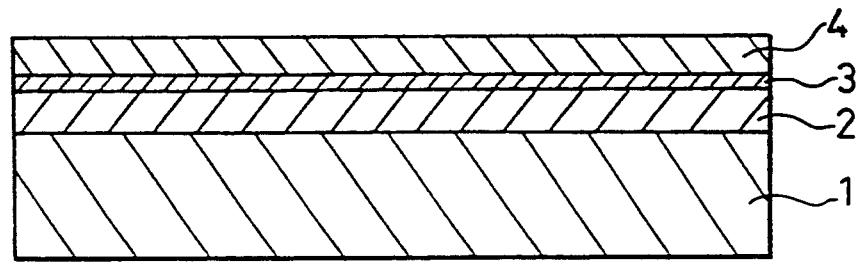
Figure 3C:
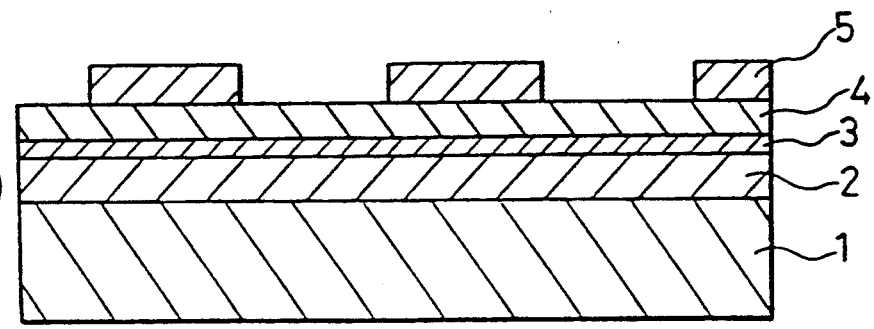
Figure 3D:
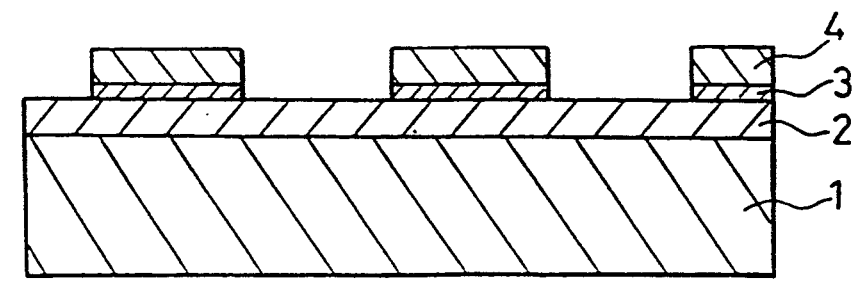
Figure 3E:
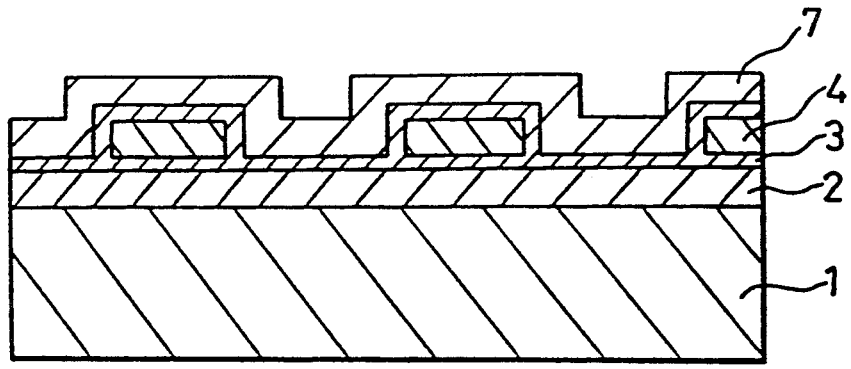
Figure 3F:
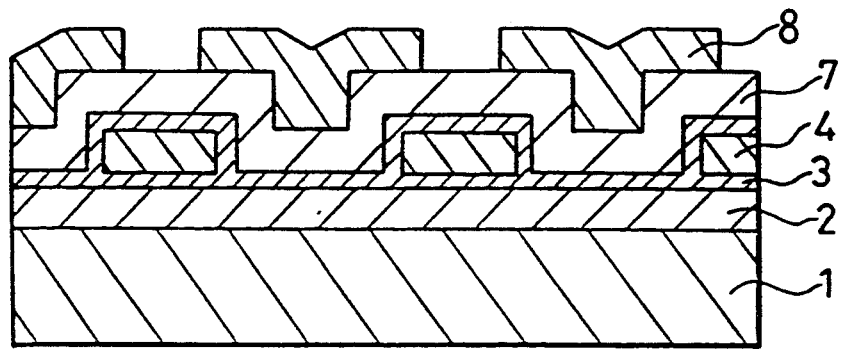
Figure 3G:
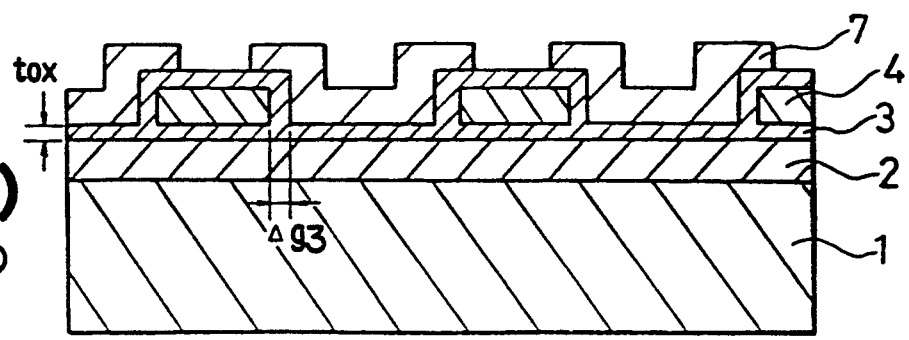
Figure 4A:
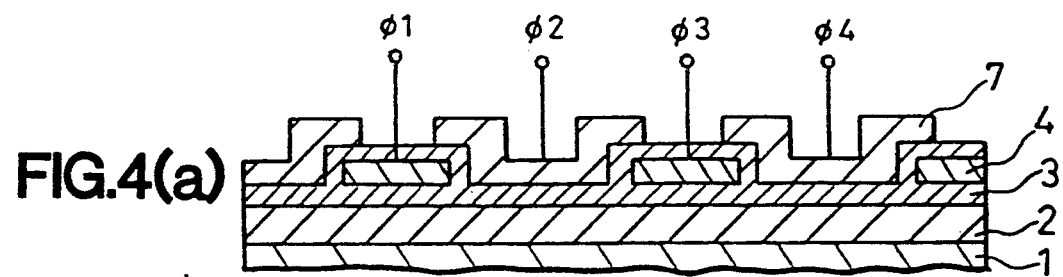
FIG. 4(a) is a cross-sectional view of a charge transfer device in accordance with an embodiment of the invention and FIGS. 4(b)-4(e) are diagrams showing potentials at the charge transfer channel region of the CCD shown in FIG. 4(a)
Figure 4B:
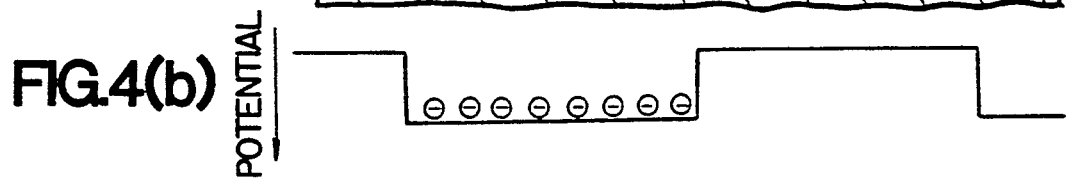
Figure 4C:
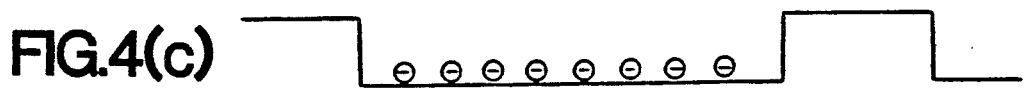
Figure 4D:
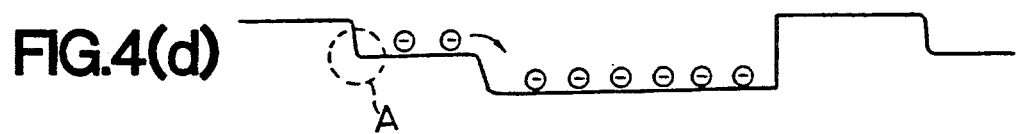
Figure 4E:
Figure 5:
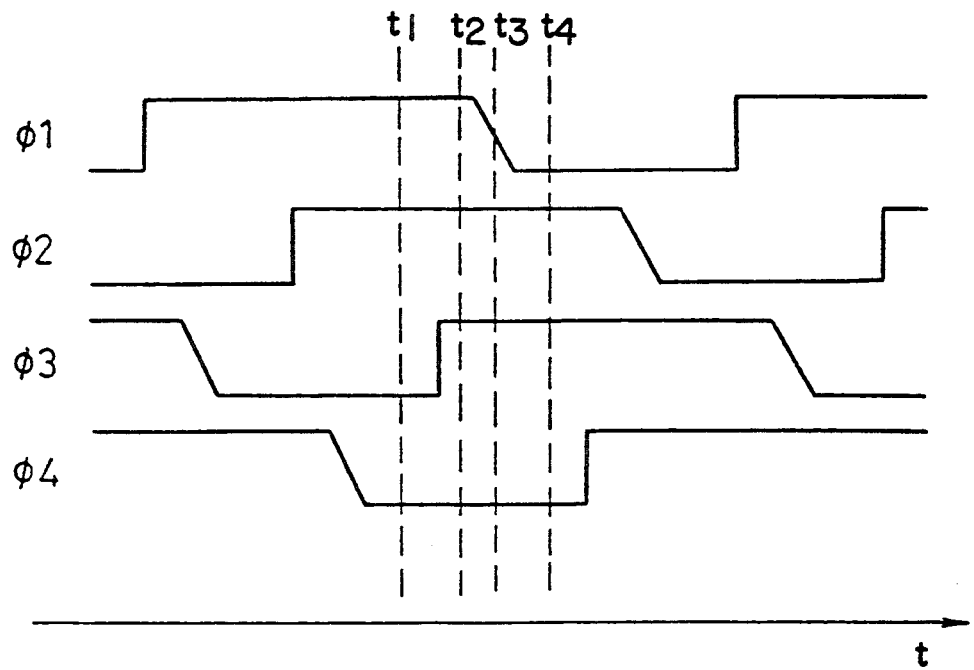
FIG. 5 is a diagram showing waveforms and timings of four clock phase signals.
Figure 6A:
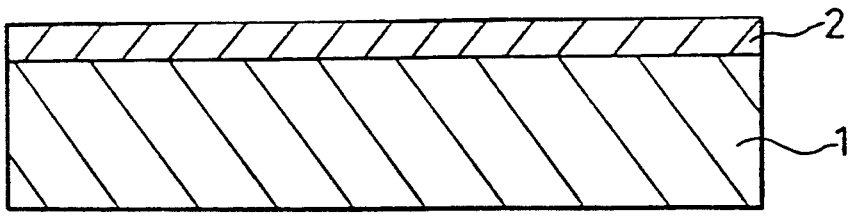
Figure 6B:
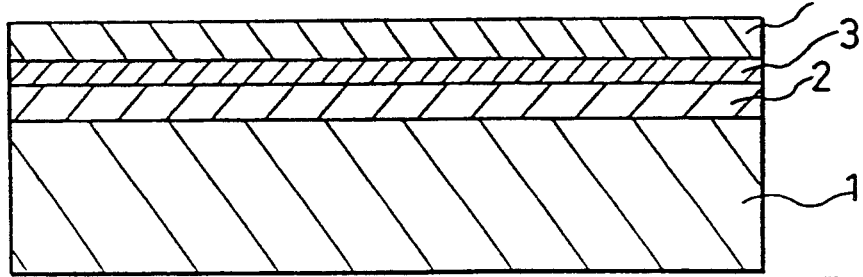
Figure 6C:
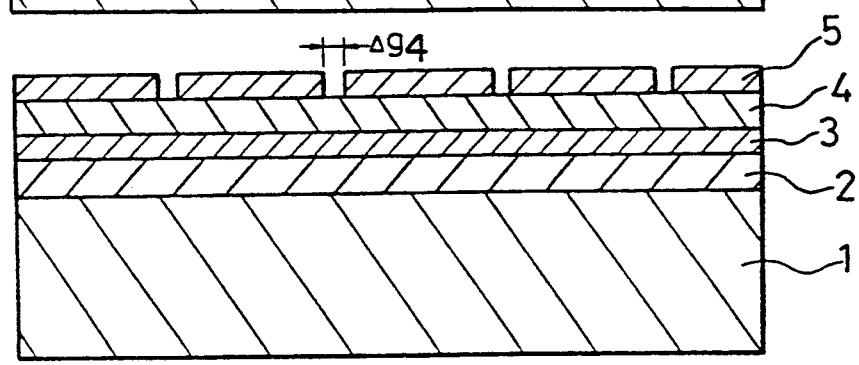
Figure 6D:
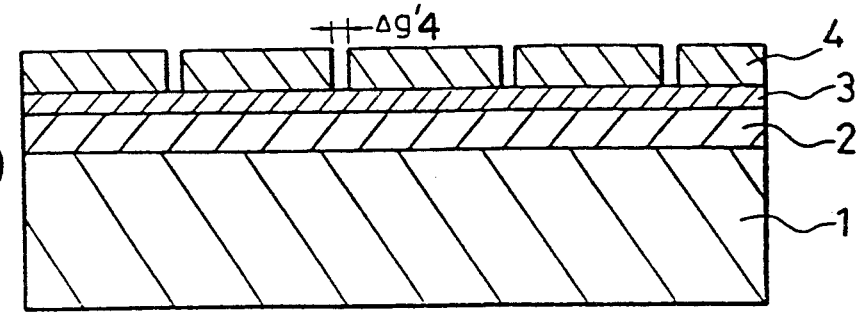
Figure 7D:
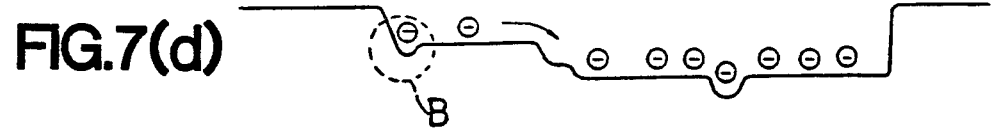
Figure 7E:

Similarly as in the prior art device, four clock signal phase $\phi 1$ to $\phi 4$ which are shown in FIG. 5 are applied as shown in FIG. 2(a), and the transfer charges are present in the charge transfer channel region below the two electrodes to which clocks $\phi 1$ and $\phi 2$ are respectively applied at time $t_1$ as shown in FIG. 2(b). A state where clock $\phi 3$ becomes H from L at time $t_2$ similarly as in FIG. 7(c) is shown in FIG. 2(c). Then the charges are distributed in the charge transfer channel region below the electrodes to which clocks $\phi 1$, $\phi 2$, and $\phi 3$ are respectively applied. Thereafter, when clock $\phi 1$ changes to L from H at time $t_3$, transfer charges move from the charge transfer channel region below the electrode to which clock $\phi 1$ is applied to the charge transfer channel region below the electrodes to which clocks $\phi 2$ and $\phi 3$ are respectively applied. Meanwhile, because there arises no "hollow" of potential such as the dotted circle part B shown in FIG. 7(d) in the charge transfer channel region below the separation of transfer electrodes in the present invention, transfer charges can move to the charge transfer channel region below the electrodes to which clocks $\phi 2$ and $\phi 3$ are respectively applied without a transfer loss.

A second embodiment of the present invention will be described with reference to FIGS. 10(a) to 12(c). In this embodiment, a nitride film 6 having a higher dielectric constant than that of the gate insulating film 3 extends under the lower surface of the polycrystalline silicon 4 as a gate electrode. This construction can result in a greater effect than the above-described first embodiment.

The production method of the CCD of this embodiment will be described.

Similarly as in the first embodiment, processes up to the process of FIG. 1(b) are carried out and subsequently as shown in FIG. 10(a), the polycrystalline silicon film 4 is processed by a photolithography technique to have a predetermined pattern width and the producible minimum size (approximately 0.4 micron) for the pattern interval $g_1$.

Furthermore, as shown in FIG. 10(b), the substrate 1 is immersed in hydrofluoric acid and thereby a part of the silicon dioxide film 3 below the spacing between the polycrystalline silicon films 4 and at the periphery thereof is removed. In this case, the size of the region 10 of the silicon dioxide film 3 to be removed can be selected by adjusting the time during which it is immersed in the hydrofluoric acid.

Next, as shown in FIG. 10(c), a silicon nitride film 6 having a higher dielectric constant than the silicon dioxide film 3 is deposited by CVD method. The CVD has an excellent coverage property and the cavities below the polycrystalline silicon films 4 can be filled.

A cross-sectional view of the CCD produced in this way is shown in FIG. 11(a). Potentials in the channel of the $n^-$ type layer 2 are considered hereinafter. The channel potential becomes shallower as the static capacitance of the insulating layer 3 below the electrode 4 becomes larger. Therefore, the potential of the region 10 when the insulating film 3 has a high dielectric constant is shallower than that of the region 12. When the potential of the region 10 is shallow, the channel potential of the region 9 having the interval $\Delta g_1$ is pulled by a fringing effect and the hollow of the potential in region 9 is reduced as shown in FIG. 11(b). Here, the dotted line shows the potential when the regions 10 and 9 do not exist and the insulating film 3 is present instead of film 6, which corresponds to FIG. 8 of the prior art device. Furthermore, the effect varies dependent on the length of the region 10 that has a high dielectric constant. As shown in FIG. 12(a), when the length L of the region 10 is increased, the force pulling the potential increases and the potential hollow becomes small as shown in FIG. 12(b). The tendency thereof is shown in FIG. 12(c). $\Delta E_1$ and $\Delta E_2$ show potential differences of the regions 9 and 10. When $\Delta E_2$ is positive a potential barrier of up to $\Delta E_2$ above 0 is generated and when the $\Delta E_2$ is negative, a potential hollow of up to $\Delta E_1$ below 0 is generated. When L becomes long, as shown in this figure, a potential lump or barrier is produced. This barrier also adversely affects the transfer efficiency of the CCD as the hollow does and it can be considered that there is an optimum value for "L".

Here, the length "L" of the region 10 is preferred to be an optimum value so that the barrier is small when the potential $\Delta E_2$ of the region 9 is positive and the "hollow" is small, that is, a value just below a length "L" that produces a barrier.

The operation of this embodiment is the same as that of the first embodiment.

In the above-described embodiment a silicon nitride film is used as a film having a high dielectric constant, but the material used here is not limited thereto and any insulating film that has a higher dielectric constant than the insulating film directly below the gate such as $Ta_2O_5$ can be employed. Further, the insulating film need not be a single material film and for example a multi-layer film comprising silicon dioxide and silicon nitride can be used.

In the above-illustrated embodiment, the transfer electrode is made of polycrystalline silicon, but the material of the electrode is not limited thereto and any conductive material which can be an electrode such as a polycide structure comprising tungsten silicide deposited on polycrystalline silicon or aluminum can be employed.

Furthermore, in the above-illustrated embodiment, the charge transfer channel region is n type but it is not limited thereto.

Furthermore, in the above-illustrated embodiment, four-phase clock signals are used, but the number of phases is not limited thereto.

As is evident from the foregoing description, according to the present invention, at least parts of the insulating layer between the charge transfer electrodes have higher dielectric constants than parts of the insulating films produced directly below the transfer electrodes. Therefore, even when the electrode separation interval of CCD electrode is wide enough that transfer loss causes a problem, the transfer loss can be reduced to such an extent that it produces no problem. In addition, the step on the substrate surface after the processing of the electrode is reduced and the subsequent processing simplified.

What is claimed is:

1. A charge transfer device comprising:
   a semiconductor substrate having a surface and including a charge transfer channel region adjacent to the surface;
   an electrically insulating film disposed on the surface of the substrate and having a dielectric constant; and
   a plurality of spaced apart charge transfer electrodes disposed on and mutually separated by said insulating film wherein a first part of said insulating film has a higher dielectric constant than a second part of said insulating film, the first part of said insulating film being disposed between said spaced apart charge transfer electrodes contacting said semiconductor substrate between said charge transfer electrodes and the second part of said insulating film being disposed between and contacting said semiconductor substrate and said charge transfer electrodes.

2. A charge transfer device as defined in claim 1 wherein a portion of the first part of said insulating layer is disposed between and contacts parts of said charge transfer electrodes and said semiconductor substrate.

* * * * *